(12) United States Patent
Kramer et al.

(10) Patent No.: US 8,405,210 B2
(45) Date of Patent: Mar. 26, 2013

(54) METHOD FOR PRODUCING A PLURALITY OF CHIPS AND A CHIP PRODUCED ACCORDINGLY

(75) Inventors: Torsten Kramer, Wannweil (DE); Matthias Boehringer, Reutlingen (DE); Stefan Pinter, Reutlingen (DE); Hubert Benzel, Pliezhausen (DE); Matthias Illing, Palo Alto, CA (US); Frieder Haag, Wannweil (DE); Simon Ambruster, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 302 days.

(21) Appl. No.: 12/677,068

(22) PCT Filed: Jul. 24, 2008

(86) PCT No.: PCT/EP2008/059688
§ 371 (c)(1),
(2), (4) Date: Jul. 21, 2010

(87) PCT Pub. No.: WO2009/033871
PCT Pub. Date: Mar. 19, 2009

(65) Prior Publication Data
US 2010/0283147 A1    Nov. 11, 2010

(30) Foreign Application Priority Data
Sep. 12, 2007  (DE) .......................... 10 2007 043 526

(51) Int. Cl.
*H01L 23/498*    (2006.01)

(52) U.S. Cl. ................. 257/737; 438/113; 257/E21.502
(58) Field of Classification Search ................. 257/787, 257/778, 737, E21.502, E23.068; 438/113
See application file for complete search history.

(56) References Cited

U.S. PATENT DOCUMENTS

| | | | |
|---|---|---|---|
| 5,950,070 A * | 9/1999 | Razon et al. ................... 438/113 |
| 6,429,530 B1 * | 8/2002 | Chen ............................. 257/778 |
| 6,656,765 B1 * | 12/2003 | DiCaprio ....................... 438/106 |
| 6,830,957 B2 * | 12/2004 | Pu et al. ........................ 438/108 |
| 2005/0087843 A1 | 4/2005 | Benzel et al. | |

FOREIGN PATENT DOCUMENTS

DE         103 50 036        5/2005

* cited by examiner

*Primary Examiner* — Roy Potter
(74) *Attorney, Agent, or Firm* — Kenyon & Kenyon LLP

(57) ABSTRACT

A production method for chips, in which as many method steps as possible are carried out in the wafer composite, that is, in parallel for a plurality of chips disposed on a wafer. This is a method for producing a plurality of chips whose functionality is implemented on the basis of the surface layer of a substrate. In this method, the surface layer is patterned and at least one cavity is produced below the surface layer, so that the individual chip regions are connected to each other and/or to the rest of the substrate by suspension webs only, and/or so that the individual chip regions are connected to the substrate layer below the cavity via supporting elements in the region of the cavity. The suspension webs and/or supporting elements are cut when the chips are separated. The patterned and undercut surface layer of the substrate is embedded in a plastic mass before the chips are separated.

10 Claims, 2 Drawing Sheets

(B-B)

(A-A)

METHOD FOR PRODUCING A PLURALITY OF CHIPS AND A CHIP PRODUCED ACCORDINGLY

FIELD OF THE INVENTION

The present invention relates to a method for producing a plurality of chips whose functionality is implemented on the basis of the surface layer of a substrate. As part of this method, the surface layer of the substrate is patterned, and at least one cavity is produced below the surface layer so that the individual chip regions are connected to each other and/or to the rest of the substrate via suspension webs only, and/or are connected to the substrate layer below the cavity via supporting elements in the region of the cavity. The suspension webs and/or supporting elements are cut when the chips are separated at the end of the production process.

Furthermore, the present invention relates to a chip manufactured accordingly.

BACKGROUND INFORMATION

Normally, the functionality of semiconductor chips is not processed individually, but rather simultaneously for a plurality of semiconductor chips, in the composite on a semiconductor wafer. It is possible to dispose several thousand components on such a wafer, depending on the chip size and the wafer size, which components must then be separated at the end of the production process.

German Patent No. DE 103 50 036 describes a method that is intended to simplify the separation of the chips. This method may also be used in particular in the production of thinned chips whose functionality is implemented only in a surface layer of the semiconductor substrate. In this instance, the lateral chip boundaries are defined with the aid of etched trenches that completely penetrate the surface layer of the substrate. Furthermore, surface micromechanical methods are used to produce cavities under the surface layer, so that in the region of a cavity the individual chip regions are connected to the substrate layer below this cavity via supporting elements only. To separate the chips, these supporting elements are then cut mechanically, for example in a pick-off process as part of the individual chip mounting.

The surfaces of the chips manufactured according to the known method are unprotected. They must subsequently be passivated individually, that is, sequentially. This proves problematic in practice, in particular for extremely thin chips.

SUMMARY OF THE INVENTION

The present invention provides a production method for chips, in which as many method steps as possible are carried out in the wafer composite, that is, in parallel for a plurality of chips situated on a wafer.

To this end, according to the present invention, in a method of the type mentioned above, the patterned and undercut surface layer of the substrate is additionally embedded in a plastic mass before the chips are separated.

Thus, as part of the method according to the present invention, all chips are provided with a plastic packaging in a single process step at the wafer level at the end of the processing. For, according to the present invention, it has been recognized that a surface layer patterned in the manner described at the outset, which is connected to the carrier substrate via suspensions and/or supporting elements only, may be embedded in plastic so extensively that the resulting plastic coating forms a good surface passivation for the chips. This plastic coating also significantly simplifies handling in the subsequent separation and mounting, in particular in the case of extremely thin chips.

In order to embed the chips in the wafer composite in a plastic mass according to the present invention, the latter must not only be deposited on the patterned surface layer, it must also be inserted in the cavities under the patterned surface layer. In an advantageous variant of the method according to the present invention, the patterned and undercut surface layer of the substrate is extrusion-coated with the plastic mass for this purpose. It is possible to achieve a very good surface covering in this manner, in particular when the extrusion-coating takes place in a vacuum. It is possible to use epoxides, biphenyls, or also multiaromatic resins as a plastic mass, for example.

It is particularly advantageous if at least the region of the patterned surface layer that forms the chips is removed from the rest of the substrate along with the plastic mass surrounding this region in one block, that is, in one single process step. For this purpose, the bond between the plastic material and the substrate material must be overcome. Furthermore, the corresponding suspension webs and/or possible supporting elements must be cut. Afterwards, the chips covered by plastic may be separated simply by traditional methods, sawing or laser cutting, for example.

In a particularly advantageous variant of the method according to the present invention, the chips are not only packaged in the wafer composite, they are also prepared for a flip-chip mounting in the wafer composite. To this end, the chip regions are provided with solder bumps before being embedded in the plastic mass. Only afterwards is the patterned and undercut surface layer of the substrate embedded in the plastic mass, namely in such a manner that the solder bumps protrude from the plastic mass. After the separation, the chips packaged in this manner may be electrically contacted and mounted simply by using the solder bumps.

DETAILED DESCRIPTION

Figure 1A:
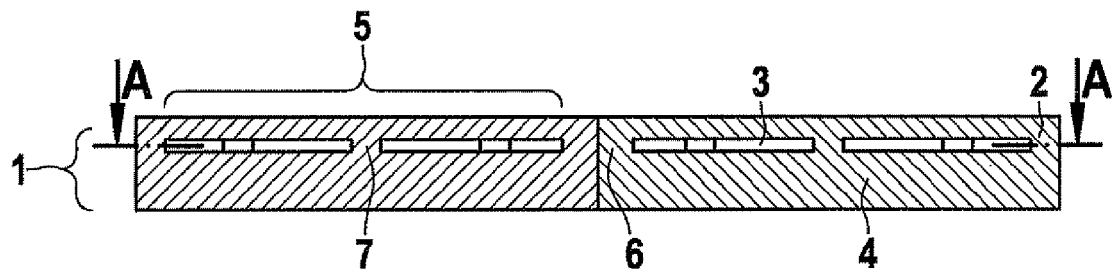
FIG. 1a shows a schematic longitudinal section through a substrate after cavities have been produced below a surface layer.

In FIGS. 1 through 5, by way of example, two chip regions are illustrated in consecutive stages of the production method according to the present invention, for a plurality of chips. Accordingly, the same reference numerals are used for all of the figures. The subsequently described exemplary embodiment relates to the production of extremely thinned chips, without restricting the invention discussed here to this type of chip. It is important only that the functionality of the chips, i.e., the electric circuit elements and possibly the mechanical pattern elements, is implemented on the basis of a surface layer 2 of a substrate 1. To this end, these circuit elements and pattern elements may be integrated either directly into surface layer 2, as in the exemplary embodiment described here, or also into a layer construction on this surface layer.

Figure 1B:
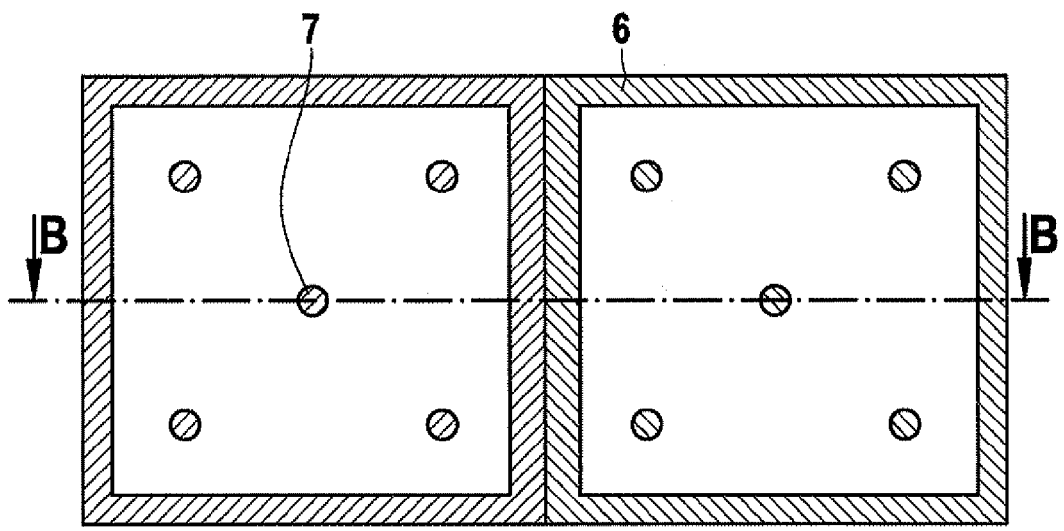
FIG. 1b shows a horizontal section through the substrate illustrated in FIG. 1a, in the region of the cavities below the surface layer.

FIGS. 1a and 1b illustrate substrate 1 after two cavities 3 have been produced below surface layer 2, namely under the regions of surface layer 2 in which one chip is to be implemented respectively. These two square, diaphragm-like chip regions 5 are delimited by a border 6 of the substrate material, and are respectively supported and fixed for subsequent processing by five supporting elements 7 of substrate material disposed in the region of cavities 3. At this point, it should be noted that the form, number, and position of the supporting elements may be selected at will, as long as their diameters are on the order of magnitude of the diaphragm thickness. Thus, in addition to column-like support elements, it is also possible to implement linear supporting walls, for example. Cavities 3 are preferably produced using surface micromechanics methods, such as the APSM (advanced porous silicon membrane) methods, supporting elements 7 also being designed as a connection between the respective chip region 5 and substrate layer 4 beneath cavity 3.

Figure 2:
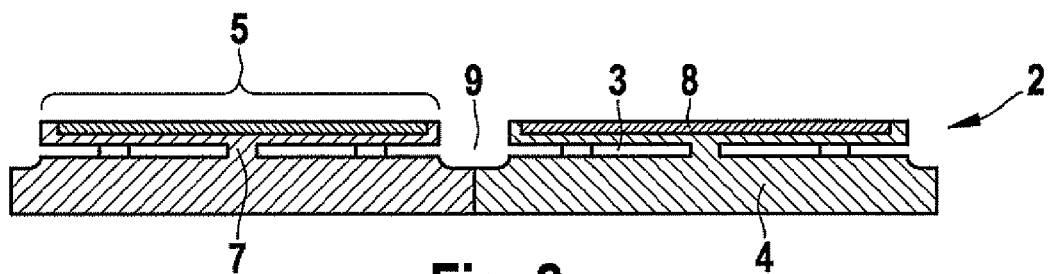
FIG. 2 shows a longitudinal section of the substrate illustrated in FIG. 1a, after a patterning of the surface layer and after the processing of circuits in the chip surfaces.

After chip regions 5 have been defined with the aid of cavities 3 below surface layer 2, the chip edges are also exposed, in that surface layer 2 is correspondingly patterned. A trenching process is preferably used for this purpose, since this patterning method allows for the implementation of any chip forms with or without thin suspension webs or connection webs in surface layer 2. Only afterwards are semiconductor circuits 8 having circuit traces and bond pads diffused in chip regions 5 of surface layer 2. The result of this method step is illustrated in FIG. 2, where the trenches are labeled 9.

Figure 3:
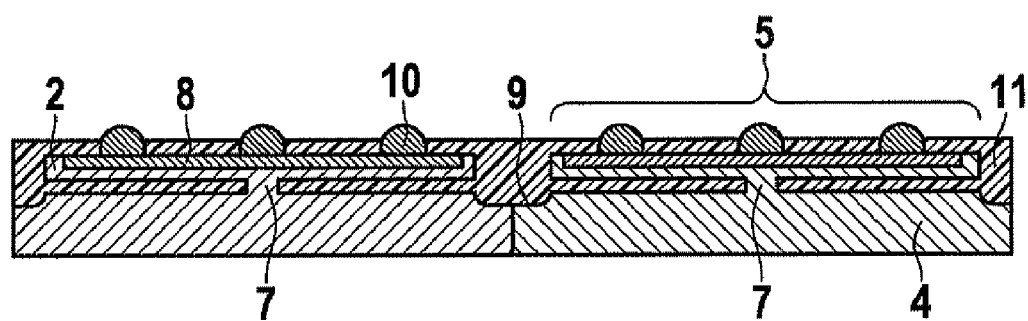
FIG. 3 shows a longitudinal section of the substrate illustrated in FIG. 2 after solder bumps have been deposited and after the surface layer has been embedded in a plastic mass.

The chips of the exemplary embodiment described here are prepared for a flip-chip mounting. For this purpose, semiconductor circuits 8 on the chip surfaces are respectively provided with solder bumps 10 before the patterned and undercut surface layer 2 of substrate 1 is embedded in a plastic mass 11 according to the present invention. To this end, substrate 1 may simply be sprayed with a suitable plastic mass in a wafer molding method. In order to ensure that plastic mass 11 completely fills cavities 3 below patterned surface layer 2, the molding tool is advantageously evacuated. FIG. 3 illustrates that as an electric contacting of the chips, solder bumps 10 are protected during molding, so that they protrude from plastic covering 11 and are still solderable later, during the chip mounting.

Figure 4:
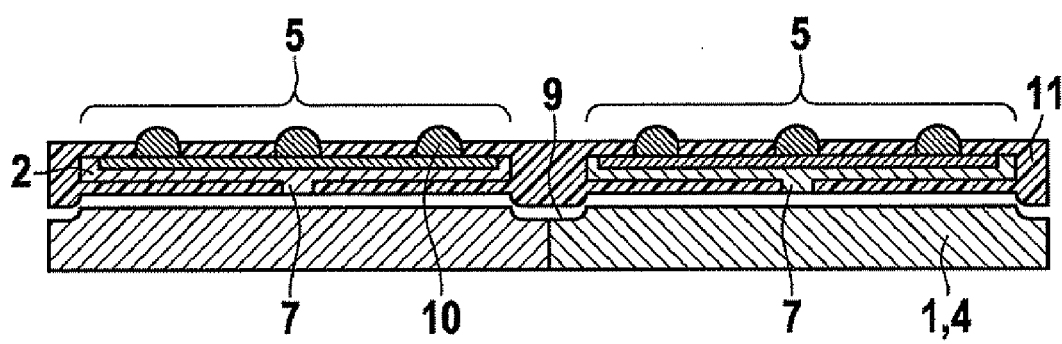
FIG. 4 shows a longitudinal section of the substrate illustrated in FIG. 3 during the removal of the surface layer covered with plastic.

The molded block, along with all chips embedded in plastic mass 11, is then removed from the rest of substrate 1 in one process step, which is shown in FIG. 4. Supporting elements 7 and possible suspension webs formed in surface layer 2 are cut in the process. Since the molding compound does not bond very well to bare silicon, which is frequently used as a substrate material, the molded block may be disconnected from the rest of the substrate with relatively little effort in these cases. The removal of the plastic block may also be supported by a shearing or peeling motion, or by using ultrasound.

Figure 5:
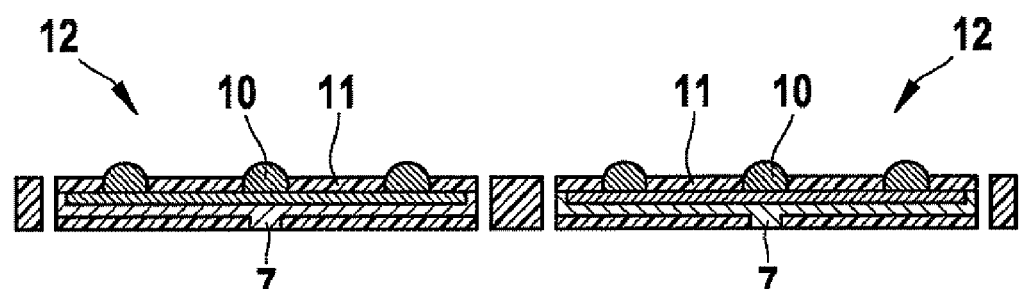
FIG. 5 shows the chips obtained from the composite illustrated in FIG. 4 after separation.

Only afterwards are the already packaged chips 12 separated by sawing or laser cutting the composite of plastic mass 11 and patterned surface layer 2 in the region of trenches 9 between the individual chip regions 5. Chips 12 obtained in this manner are illustrated in FIG. 5. As mentioned already, solder bumps 10 protrude from plastic covering 11 of individual chips 12. Since the surface of chips 12 is already passivated by plastic covering 11, no underfill is required in a subsequent flip-chip mounting. Finally, reference is made to the fact that due to the production method according to the present invention, suspension webs and/or supporting elements 7 are seen in the outer surface of plastic covering 11.

What is claimed is:

1. A method for producing a plurality of chips whose functionality is implemented on the basis of a surface layer of a substrate, the method comprising:

patterning the surface layer and producing at least one cavity below the surface layer, so that at least one of (a) individual chip regions are connected to each other and/or to the rest of the substrate via suspension elements only and (b) the individual chip regions are connected to a substrate layer below the cavity via supporting elements in a region of the cavity;

separating the chips, at least one of (c) the suspension elements and (d) the supporting elements being cut; and embedding the patterned and undercut surface layer of the substrate in a plastic mass before the chips are separated.

2. The method according to claim 1, wherein the patterned and undercut surface layer of the substrate is extrusion-coated.

3. The method according to claim 2, wherein the extrusion-coating takes place in a vacuum.

4. The method according to claim 1, wherein the plastic mass includes an epoxide, a biphenyl, or a multiaromatic resin.

5. The method according to claim 1, wherein at least a region of the patterned surface layer that forms the chips is removed from the rest of the substrate along with the plastic mass surrounding the region, the corresponding suspension elements and/or supporting elements being cut, and the chips embedded in the plastic mass are separated only afterwards.

6. The method according to claim 1, wherein the chip regions include solder bumps for a flip-chip mounting, and the patterned and undercut surface layer of the substrate is then embedded in the plastic mass in such a manner that the solder bumps protrude out of the plastic mass.

7. A chip comprising:
   a plastic covering;
   solder bumps protruding out of the plastic covering;
   and at least one of (a) suspension webs and (b) supporting elements situated in an outer surface of the plastic covering.

8. The chip recite in claim 7, wherein the plastic covering covers a region from where the solder bumps protrude out of the plastic covering.

9. The chip recite in claim 8, wherein the plastic covering substantially covers the region from where the solder bumps protrude out of the plastic covering.

10. The chip recite in claim 7, wherein no underfill is required in a subsequent flip-chip mounting due to the plastic covering.

* * * * *

UNITED STATES PATENT AND TRADEMARK OFFICE
CERTIFICATE OF CORRECTION

PATENT NO. : 8,405,210 B2  Page 1 of 1
APPLICATION NO. : 12/677068
DATED : March 26, 2013
INVENTOR(S) : Kramer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 434 days.

Signed and Sealed this
First Day of September, 2015

Michelle K. Lee
*Director of the United States Patent and Trademark Office*